United States Patent
Ku et al.

(10) Patent No.: US 9,854,672 B2
(45) Date of Patent: Dec. 26, 2017

(54) PRINTED CIRCUIT BOARD AND METHOD OF MANUFACTURING A PRINTED CIRCUIT BOARD

(71) Applicant: SAMSUNG DISPLAY CO., LTD., Yongin, Gyeonggi-do (KR)

(72) Inventors: Jung-Hoon Ku, Chungcheongnam-do (KR); Yong-Woo Koo, Gyeonggi-do (KR); Ki-Yong Kim, Chungcheongnam-do (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 200 days.

(21) Appl. No.: 14/525,830

(22) Filed: Oct. 28, 2014

(65) Prior Publication Data

US 2015/0250057 A1    Sep. 3, 2015

(30) Foreign Application Priority Data

Mar. 3, 2014  (KR) ........................ 10-2014-0024864

(51) Int. Cl.
| | | |
|---|---|---|
| *H05K 1/11* | (2006.01) | |
| *H05K 1/02* | (2006.01) | |
| *G01R 31/04* | (2006.01) | |
| *H05K 7/02* | (2006.01) | |
| *G02F 1/1345* | (2006.01) | |
| *H05K 3/34* | (2006.01) | |
| *H05K 3/36* | (2006.01) | |

(52) U.S. Cl.
CPC ........... *H05K 1/118* (2013.01); *G01R 31/048* (2013.01); *G02F 1/13452* (2013.01); *G02F 2201/36* (2013.01); *H05K 3/3452* (2013.01); *H05K 3/363* (2013.01); *H05K 2203/125* (2013.01); *H05K 2203/308* (2013.01)

(58) Field of Classification Search
CPC . H05K 1/118; H05K 1/11; H05K 7/02; H05K 1/02; H05K 1/117; H05K 1/028; H05K 7/026; G01R 31/048
USPC ......................................... 361/792
See application file for complete search history.

(56) References Cited

U.S. PATENT DOCUMENTS

2003/0232536 A1    12/2003  Saito et al.
2013/0300318 A1*   11/2013  Kim .................. G08B 5/36
                                                      315/313

(Continued)

FOREIGN PATENT DOCUMENTS

| KR | 1019970058434 | 7/1997 |
|----|---------------|--------|
| KR | 1020000073836 | 12/2000 |
| KR | 1020020065691 | 8/2002 |

(Continued)

*Primary Examiner* — Eric Thomas
*Assistant Examiner* — Michael P McFadden
(74) *Attorney, Agent, or Firm* — F. Chau & Associates, LLC

(57) ABSTRACT

A printed circuit board includes a substrate and a plurality of pad forming regions disposed thereon. The plurality of pad forming regions are spaced apart from each other by a predetermined distance. A plurality of connection pads are disposed on a portion of the plurality of pad forming regions. The plurality of connection pads are configured to transmit or receive a signal to an external device or from the external device. The printed circuit board includes a path configured for the transportation of moisture therein.

15 Claims, 12 Drawing Sheets

(56) References Cited

U.S. PATENT DOCUMENTS

2014/0097865 A1* 4/2014 Han .................. H01L 23/538
324/762.01
2014/0177182 A1* 6/2014 Cho .................. H05K 3/30
361/749

FOREIGN PATENT DOCUMENTS

| KR | 1020030096081 | 12/2003 |
| KR | 1020070007431 | 1/2007 |

* cited by examiner

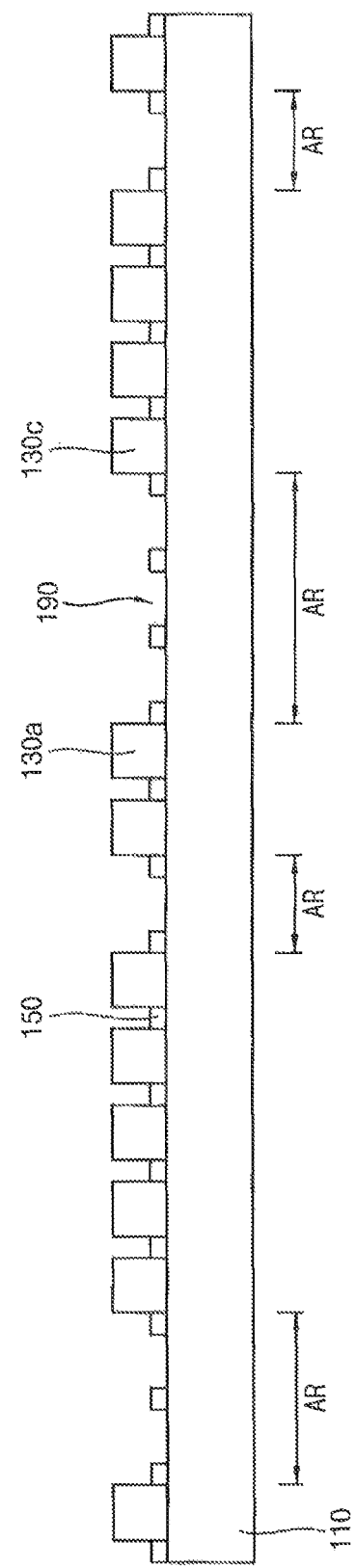

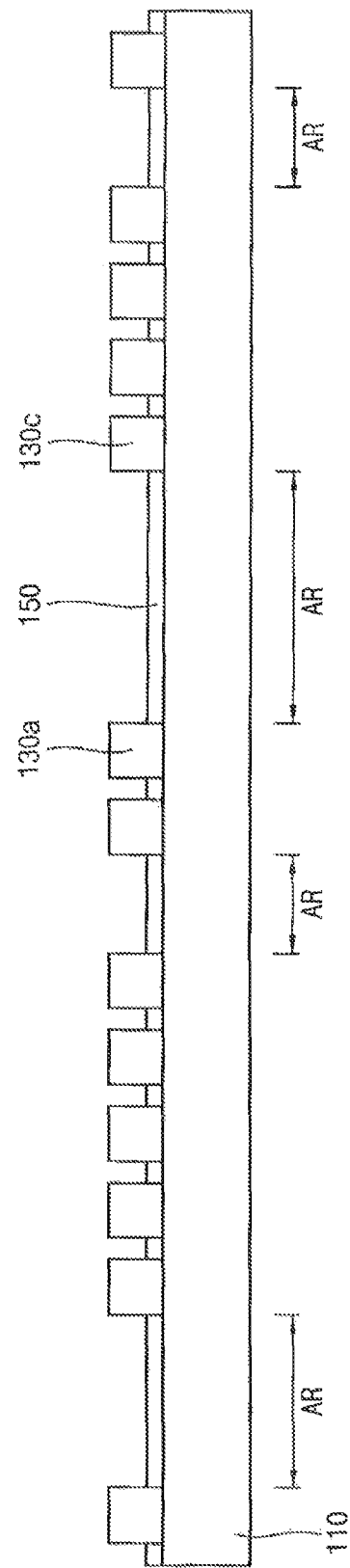

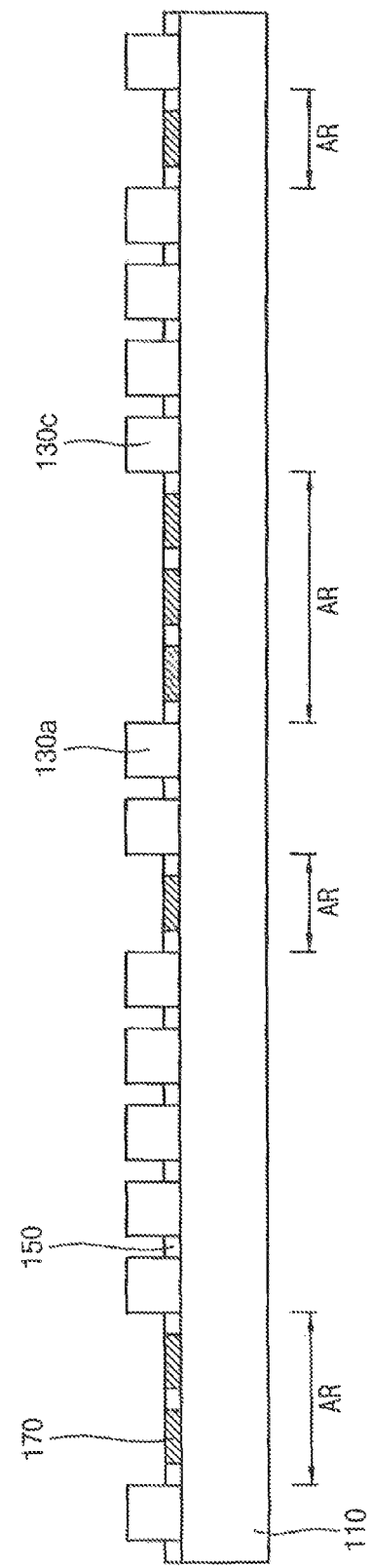

PRINTED CIRCUIT BOARD AND METHOD OF MANUFACTURING A PRINTED CIRCUIT BOARD

CROSS-REFERENCE TO RELATED APPLICATION

This application claims priority under 35 U.S.C. §1.19 to Korean Patent Application No. 10-2014-0024864 filed on Mar. 3, 2014, the disclosure of which is incorporated by reference herein in its entirety.

TECHNICAL FIELD

Exemplary embodiments of the present inventive concept relate to a printed circuit board and more particularly to a method of manufacturing the printed circuit board.

DISCUSSION OF RELATED ART

In a display panel including a printed circuit board (PCB), the display panel and the PCB may be electrically connected via a flexible printed circuit board (FPCB). The PCB and the FPCB, or the display panel and the FPCB may be connected to each other by a soldering process, an anisotropic conductive film (ACF), a non-conductive film (NCF) or a connector. In the soldering process, pads of the PCB may be spaced apart from each other, and the soldering process might not be performed at a region between the pads. After the PCB and the display panel are connected using the FPCB, a process of checking the display panel may be performed. When the checking process is performed, moisture may permeate into an empty space between the pads of the PCB. The moisture may remain between the PCB and the FPCB. After the process of checking the display panel is ended, the moisture might not be easily dried or removed. A burning phenomenon may occur between the PCB and the FPCB.

SUMMARY

Exemplary embodiments of the present inventive concept may provide a printed circuit board removing moisture permeated between a flexible printed circuit board and a printed circuit board.

Exemplary embodiments of the present inventive concept may provide a method of manufacturing a printed circuit board and removing moisture permeated between the flexible printed circuit board and the printed circuit board.

Exemplary embodiments of the present inventive concept may provide a display device including a printed circuit board capable of having moisture permeated between the flexible printed circuit board and the printed circuit board removed.

According exemplary embodiments of the present inventive concept, a printed circuit board includes a substrate having a plurality of connection pad forming regions disposed thereon. The pad forming regions of the plurality of pad forming regions are spaced apart from each other by a predetermined distance. A plurality of connection pads are disposed on a portion of the plurality of pad forming regions. The plurality of connection pads is configured to transmit or receive a signal to an external device or from the external device. A path for moisture is disposed between two adjacent connection pads of the plurality of connection pads.

The pad forming regions may include connection pad forming regions on which connection pads may be disposed and non-connection pad forming regions on which connection pads might not be disposed.

The printed circuit board may include a solder resist disposed on the at least one of the pad forming regions on which no connection pad is disposed.

The printed circuit board may include a moisture absorbent disposed on the at least one of the pad forming regions on which no connection pad is disposed.

The connection pads may be bonded to a flexible printed circuit board that is electrically connected to the external device.

The signal may be transmitted or received through the connection pads and may include a power signal, a data signal, or a ground signal.

According to exemplary embodiments of the present inventive concept, a method of manufacturing a printed circuit board includes providing a substrate having a plurality of pad forming regions that are spaced apart from each other by a predetermined distance. A plurality of connection pads transmitting or receiving a signal to an external device or from the external device is formed on a portion of the plurality of pad forming regions. A path for moisture is formed between two adjacent connection pads of the plurality of connection pads.

The method may include forming at least one non-connection pad on the plurality of pad forming regions. A solder resist may be formed at a peripheral region surrounding the plurality of connection pads and the at least one non-connection pad on the substrate. A recess may be formed by removing the at least one non-connection pad. The recess may be filled.

The recess may be filled with a solder resist.

The recess may be filled with a moisture absorbent.

The pad forming regions may include connection pad forming regions on which connection pads may be formed and non-connection The plurality of connection pads may be bonded to a flexible printed circuit board that is electrically connected to the external device.

The signal may be transmitted or received through the connection pads and may include a power signal, a data signal, or a ground signal.

According to exemplary embodiments of the present inventive concept, a display device includes a printed circuit board including a substrate having a plurality of pad forming regions. The plurality of pad forming regions are spaced apart from each other by a predetermined distance. A plurality of connection pads are disposed on a portion of the plurality of pad forming regions. The plurality of connection pads are configured to transmit or receive a signal to an external device or from the external device. A main printed circuit board is electrically connected to the printed circuit board. A display panel is electrically connected to the main printed circuit board via the printed circuit board. A path for moisture is disposed between two adjacent connection pads of the plurality of connection pads.

A first flexible printed circuit board may connect the printed circuit board and the display panel. A second flexible printed circuit board may connect the printed circuit board and the main printed circuit board.

A driving integrated circuit may be disposed on the first flexible printed circuit board.

The pad forming regions may include connection pad forming regions on which connection pads may be disposed and non-connection pad forming regions on which connection pads might not be disposed.

A solder resist may be disposed on the at least one of the pad forming regions on which no connection pad is formed.

A moisture absorbent may be disposed on the at least one of the pad forming regions on which no connection pad is formed.

Moisture can be removed from the printed circuit board through the path for moisture.

The method of manufacturing the display device according to exemplary embodiments of the present inventive concept can manufacture the printed circuit board including the path for moisture.

BRIEF DESCRIPTION OF THE DRAWINGS

The above and other features of the present inventive concept will become more apparent by describing in detail exemplary embodiments thereof with reference to the accompanying drawings, in which:

FIGS. 5A to 5E are cross-sectional views illustrating a method of manufacturing the printed circuit board in accordance with exemplary embodiments of the present inventive concept;

DETAILED DESCRIPTION OF THE EMBODIMENTS

Figure 1:
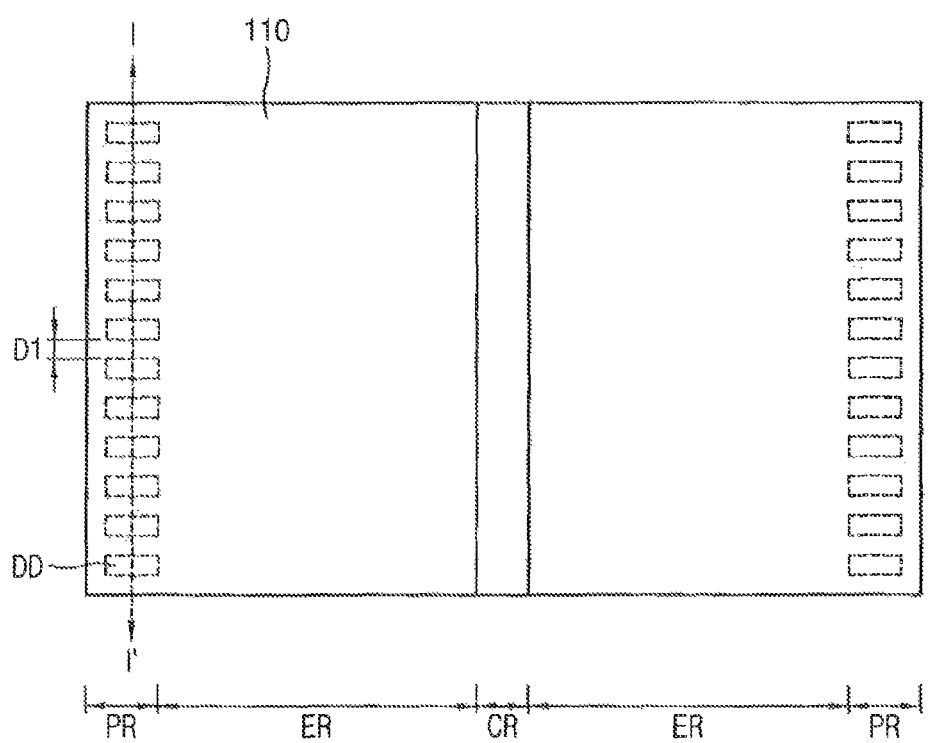
FIG. 1 is a plan view illustrating a printed circuit board in accordance with exemplary embodiments of the present inventive concept.

Hereinafter, exemplary embodiments of the present inventive concept will be described in more detail with reference to the accompanying drawings. Identical or similar reference numerals may refer to the same elements throughout the specification and drawings.

Figure 2:
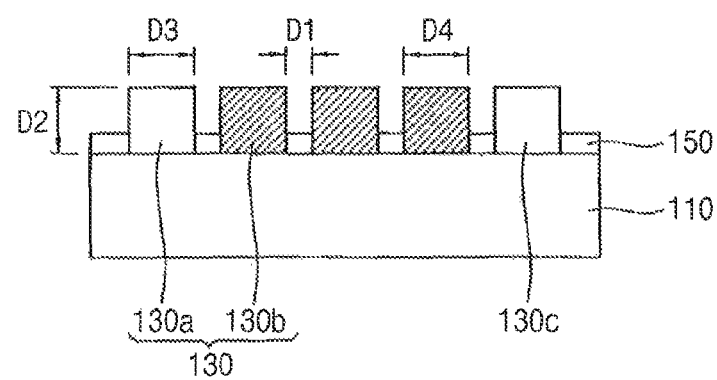
FIG. 2 is a cross-sectional view illustrating pads of the printed circuit board of FIG. 1.

FIG. 1 is a plan view illustrating a printed circuit board in accordance with exemplary embodiments of the present inventive concept. FIG. 2 is a cross-sectional view illustrating pads of the printed circuit board of FIG. 1. Non-connection pads 130b may be disposed on a substrate 110 and connection pads 130a and 130c may be disposed on the substrate 110 of a printed circuit board 100 in accordance with exemplary embodiments of the present inventive concept.

Referring to FIGS. 1 and 2, the printed circuit board 100 may include the substrate 110, pads 130, and a protecting layer 150.

The substrate 110 may include a pad region PR, an electrode region ER, and a circuit element region CR. The pad region PR may include a plurality of pad forming regions DD that are spaced apart from each other by a predetermined distance. The pad forming regions DD may include a plurality of connection pads forming regions D3 and a plurality of non-connection pads forming regions D4. The pads 130 may be disposed in the pad forming regions DD. The connection pads 130a and 130c may be disposed on the connection pad forming regions D3. The non-connection pads 130b may be disposed in the non-connection pad forming regions D4. The connection pads 130a and 130c may receive a signal (e.g., an electrical signal) from an external device or may transmit the signal to the external device. The non-connection pads 130b might not receive the signal from the external device or might not transmit the signal to the external device. A region between the pads 130 may be a peripheral region D1. The predetermined distance may be substantially the same as a width of the peripheral region D1. Thus, the pad forming regions DD may be spaced apart from each other by a width of the peripheral region D1 (see, e.g., FIG. 1). For example, the connection pad forming region D3 may be surrounded by two peripheral regions D1 adjacent the connection pad forming region D1. The non-connection pad forming region D4 may be surrounded by two peripheral regions D1 adjacent the non-connection pad forming region D4. According to exemplary embodiments of the present inventive concept, when the pad region PR illustrated in FIG. 1 includes the pad forming regions DD, the pad region PR may include the connection pad forming regions D3, the non-connection pad forming regions D4, and the peripheral regions D1.

In the electrode region ER, a plurality of electrodes corresponding to each of the pads 130 may be disposed within the substrate 110. For example, the plurality of electrodes may be disposed in an electrode patterning layer of the substrate 110. The connection pads 130a and 130c which may be formed on the connection pad forming region D3 may be electrically connected to the plurality of electrodes disposed within the substrate 110. The signal received from the external device may be transmitted to a circuit element which may be disposed on the circuit element region CR via the plurality of electrodes. For example, the connection pads 130a and 130c may be electrically connected to the circuit element via the plurality of electrodes. When the connection pads 130a and 130c are electrically connected to the external device, the connection pads 130a and 130c may be bonded to a flexible printed circuit board that is connected to the external device. A soldering process may be performed on the connection pads 130a and 130c. A received signal from the external device may include an electrical signal such as a power signal, a data signal, a ground signal, or the like. The non-connection pads 130b may be disposed on the non-connection pad forming regions D4 and may be electrically connected to the electrode formed within the substrate 110. The non-connection pads 130b might not receive a signal from the external device. For example, the non-connection pads 130b need not be connected to the external device. The soldering process need not be performed on the non-connection pads 130b. For example, when the pads 130 (e.g., the connection pads 130a and 130c and the non-connection pads 130b) transmit the signal, crosstalk may be generated between the electrodes which may be connected to the pads 130. The signal may have noise due to the crosstalk. The signal having noise may generate a distortion phenomenon. Thus, the printed circuit board 100 need not use a portion pad (e.g., the non-connection pads 130b) of the pads 130.

A plurality of circuit elements corresponding to each of the plurality of electrodes may be disposed in the circuit element region CR. The circuit element may be electrically connected to the connection pads 130a and 130c. The circuit element may receive the signal applied from the external device via the connection pads 130a and 130c and the plurality of electrodes.

As illustrated in FIG. 2, the pads 130 may be disposed on the pad forming regions DD of the substrate 110. The pads 130 may be spaced apart from each other by the predetermined distance (e.g., the peripheral region D1). A height and a width (e.g., the connection pad forming regions D3 and the non-connection pad forming regions D4) of the pads 130 may be substantially the same. The pads 130 may include at least one connection pad 130a or 130c and at least one non-connection pads 130b. The connection pads 130a and 130c may receive the signal from the external device or may transmit the signal to the external device. The non-connection pads 130b might not receive the signal from the external device or might not transmit the signal to the external device. According to exemplary embodiments of the present inventive concept, the connection pads 130a and 130c may be disposed in a portion of the pad forming regions DD. At least one of the pad forming regions DD may be disposed between at least two connection pads 130a and 130c. The connection pads 130a and 130c, need not be formed in the pad forming region DD. Moisture may be discharged via space between the connection pads 130a and 130c.

For example, in at least one pad forming region DD where the connection pads 130a and 130c are not disposed, the non-connection pads 130b may be formed, and then the non-connection pads 130b may be removed. The protecting layer 150 may be disposed on the substrate 110. The protecting layer 150 may protect the electrode patterning layer. The electrode patterning layer may be electrically insulated by the protecting layer 150.

Figure 3:
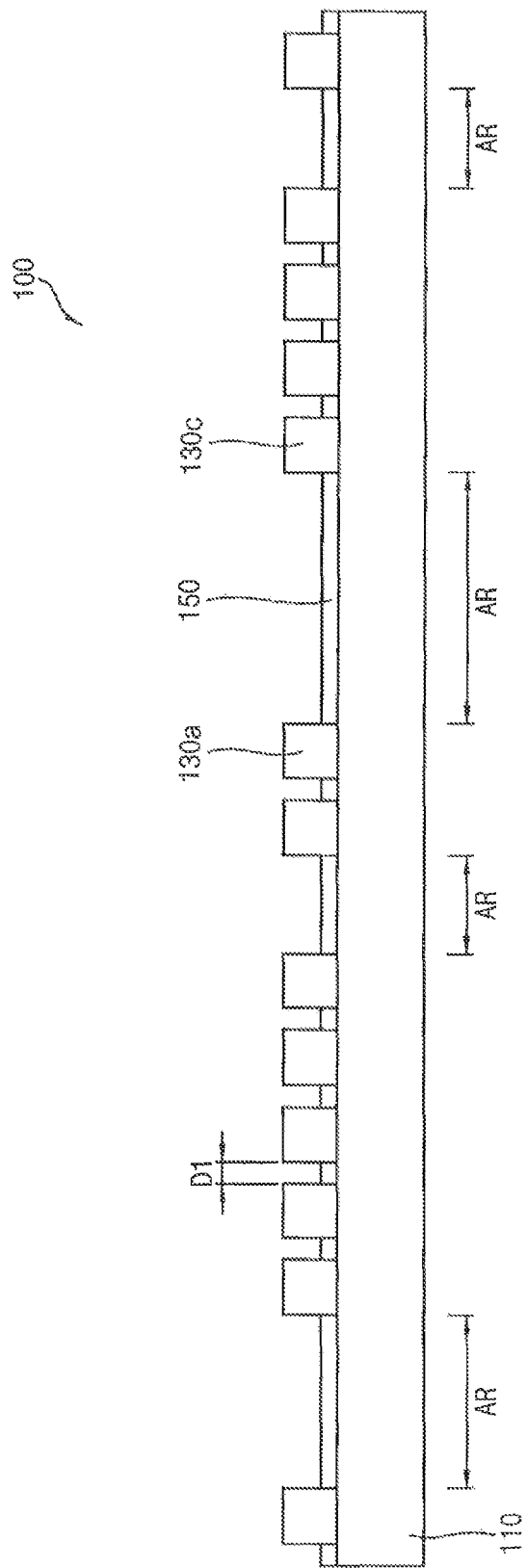
FIG. 3 is a cross-sectional view taken along a line I-I' of FIG. 1 illustrating the printed circuit board in accordance with exemplary embodiments of the present inventive concept.

FIG. 3 is a cross-sectional view taken along a line 14' of FIG. 1 illustrating the printed circuit board in accordance with exemplary embodiments of the present inventive concept.

Referring to FIG. 3, a printed circuit board 100 may include the substrate 110, connection pads 130a and 130c, and the protecting layer 150.

The substrate 110 may include connection pad forming regions D3, non-connection pad forming regions D4, and a path for moisture AR. The pad 130 may include connection pads 130a and 130c and non-connection pads 130b. The non-connection pad forming regions D4 of the printed circuit board 100 according to exemplary embodiments of the present inventive concept need not include the non-connection pads 130b. The non-connection pads 130b may be removed from the substrate 110. The non-connection pad forming regions D4 and the non-connection pads 130b and a process of forming the non-connection pads 130b which may be formed on the non-connection pad forming regions D4 and removed will be described in more detail below.

The substrate 110 may include the connection pad forming regions D3, the path for moisture AR, and the peripheral region D1. The substrate 110 may have a stacked structure. The stacked structure of the substrate 110 may include an insulating film layer, an electrode patterning layer, and/or the protecting layer 150. The electrode patterning layer may be disposed on the insulating film layer. The protecting layer 150 may be disposed on the electrode patterning layer. For example, the insulating film layer may include an insulating material such as polyimide, polyester or prepreg. Electrodes may be disposed in the electrode patterning layer so that the connection pads 130a and 130c disposed on a pad region PR are electrically connected to a circuit element disposed in a circuit element region CR. For example, the electrodes of the electrode patterning layer may include aluminum (Al), aluminum alloy, aluminum nitride (AlNx), silver (Ag), silver alloy, tungsten (W), tungsten nitride (WNx), copper (Cu), copper alloy, nickel (Ni), chromium (Cr), chromium nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), starum oxide (SnOx), indium oxide (InOx), gallium oxide (GaOx), and/or indium zinc oxide (IZO). The protecting layer 150 may protect the electrode patterning layer. The electrode patterning layer may be electrically insulated by the protecting layer 150. Thus, the protecting layer 150 need not be formed on a top surface of the pads 130 electrically connected to an external device. The protecting layer 150 may include a solder resist.

The pads 130 may be disposed on the electrode patterning layer of the substrate 110. The pads 130 may include the connection pads 130a and 130c. The connection pads 130a and 130c may be disposed on the connection pad forming regions D3 of the substrate 110. The connection pads 130a and 130c may receive the signal from an external device or may transmit the signal to the external device. The connection pads 130a and 130c may be electrically connected to the electrodes disposed in the substrate 110.

The signal received from the external device may be transmitted to the circuit element which may be disposed on the circuit element region CR via the electrodes. For example, the connection pads 130a and 130c may be electrically connected to the circuit element via the electrodes. When the connection pads 130a and 130c are electrically connected to the external device, the connection pads 130a and 130c may be bonded to the flexible printed circuit board that is connected to the external device. A soldering process may be performed on the connection pads 130a and 130c. The received signal from the external device may include the electrical signal such as the power signal, the data signal, the ground signal, or the like. According to exemplary embodiments of the present inventive concept, the connection pads 130a and 130c may be disposed on a portion of the pad forming regions D1). At least one the pad forming region DD may be disposed between at least two connection pads 130a and 130c. The connection pads 130a and 130c need not be formed in the pad forming region DD. Moisture may be discharged via space between the connection pads 130a and 130c.

The non-connection pads 130b may be formed on the non-connection pad forming regions D4, but the non-connection pads 130b may be removed on the substrate 110 of the printed circuit board 100. For example, the printed circuit board 100 according to exemplary embodiments of the present inventive concept need not include the non-connection pads 130b. The non-connection pad forming regions D4 may be included in the path for moisture AR. For example, when the pads 130 (e.g., the connection pads 130a and 130c and the non-connection pads 130b) transmit signals, crosstalk may be generated between the electrodes which are connected to the pads 130. The signals may have noise due to the crosstalk. The signal having noise may generate the distortion phenomenon. Thus, the printed circuit board 100 need not include a portion pad (e.g., the non-connection pads 130*b*) of the pads 130. When non-connection pads 130*b* which may be formed on the non-connection pad forming regions D4 are removed from the substrate 110, the non-connection pad forming regions D4 and the peripheral regions D1 adjacent the non-connection pad forming regions D4 may become the path for moisture AR. For example, one non-connection pad 130*b* may have two peripheral regions D1 adjacent each of the non-connection pads 130*b*. The path for moisture AR may include one non-connection pad forming region D4 and two peripheral regions D1. Two non-connection pads 130*b* may have one peripheral region D1 positioned between the non-connection pads 130*b* and two peripheral regions D1 adjacent an outside of the non-connection pads 130*b*. For example, the path for moisture AR may include two non-connection pad forming regions D4 and three peripheral regions D1.

When the non-connection pads 130*b* which may be formed in the non-connection pad forming regions D4 are removed from the substrate 110, a recess may be formed in the non-connection pad forming regions D4. According to exemplary embodiments of the present inventive concept, the printed circuit board 100 need not initially include the non-connection pads 130*b*. For example, when the pads 130 are disposed on the substrate 110, the connection pads 130*a* and 130*c* may be disposed on the connection pad forming regions D3. The non-connection pads 130*b* need not be formed on the non-connection pad forming regions D4. When a position of the connection pads 130*a* and 130*c* and the non-connection pads 130*b* is changed, a position of changed pads 130 may be rearranged in a process of forming the pads 130. A process of manufacturing the printed circuit board 100 may include a process of forming the connection pads 130*a* and 130*c* on the substrate 110 and a process of forming the protecting layer 150 on the substrate 110. However, a process of removing the non-connection pads 130*b* from the substrate 110 need not be performed. Thus, a manufacturing cost of the printed circuit board 100 may be decreased. The recess that may be formed by removing or omitting the non-connection pads 130*b* may be filled with an auxiliary member. According to exemplary embodiments of the present inventive concept, the recess may be filled with a same material as that of the protecting layer 150. For example, the recess may be filled with the solder resist. In a process of checking the display panel, when moisture is permeated between the flexible printed circuit board and the printed circuit board 100 via peripheral region D1 between the connection pads 130*a* and 130*c* after the printed circuit board 100 is bonded to the flexible printed circuit board, the moisture may be removed via the path for moisture AR.

In the printed circuit board 100 according to exemplary embodiments of the present inventive concept including the path for moisture AR, in a process of checking the display panel, when moisture is permeated between the flexible printed circuit board and the printed circuit board 100, moisture may be removed via the path for moisture AR. Accordingly, the connection pads 130*a* and 130*c* of the printed circuit board 100 need not be damaged by moisture.

Figure 4:
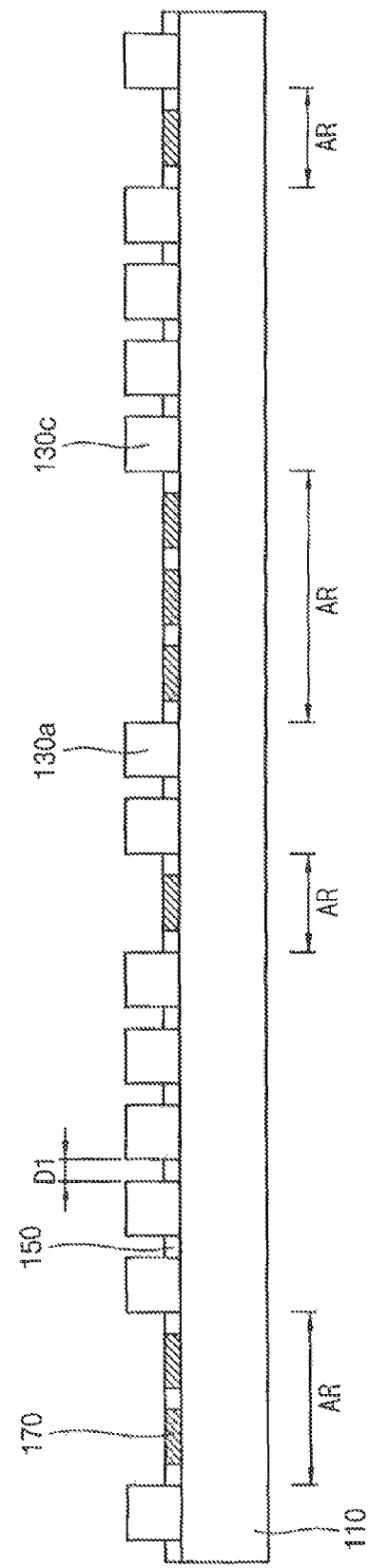
FIG. 4 is a cross-sectional view taken along the line I-I' of FIG. 1 illustrating the printed circuit board in accordance with exemplary embodiments of the present inventive concept.

FIG. 4 is a cross-sectional view taken along the line I-I' of FIG. 1 illustrating the printed circuit board in accordance with exemplary embodiments of the present inventive concept. The printed circuit board illustrated in FIG. 4 may have a configuration substantially the same as or similar to that of the printed circuit board 100 described with reference to FIG. 3 except for the recess filled with an auxiliary member 170. In FIG. 4, descriptions for elements, which are substantially the same as or similar to the elements described with reference to FIG. 3 may be omitted.

Referring to FIG. 4, the recess of the printed circuit board may be filled with the auxiliary member 170. For example, the auxiliary member 170 may include an absorbent such as silica gel, or the like. In the process of checking the display panel, when moisture is permeated between the flexible printed circuit board and the printed circuit board 100 via peripheral region D1 between the connection pads 130*a* and 130*c* after the printed circuit board 100 is bonded to the flexible printed circuit board, moisture may be removed via the path for moisture AR. Moisture may be absorbed by the auxiliary member 170.

In the printed circuit board 100 according to exemplary embodiments of the present inventive concept including the path for moisture AR, in a process of checking the display panel, when moisture is permeated between the flexible printed circuit board and the printed circuit board 100, the moisture may be removed via the path for moisture AR, and may be absorbed by the auxiliary member 170. Accordingly, the connection pads 130*a* and 130*c* of the printed circuit board 100 need not be damaged by moisture.

FIGS. 5A to 5E are cross-sectional views illustrating a method of manufacturing the printed circuit board in accordance with exemplary embodiments of the present inventive concept.

Figure 5A:
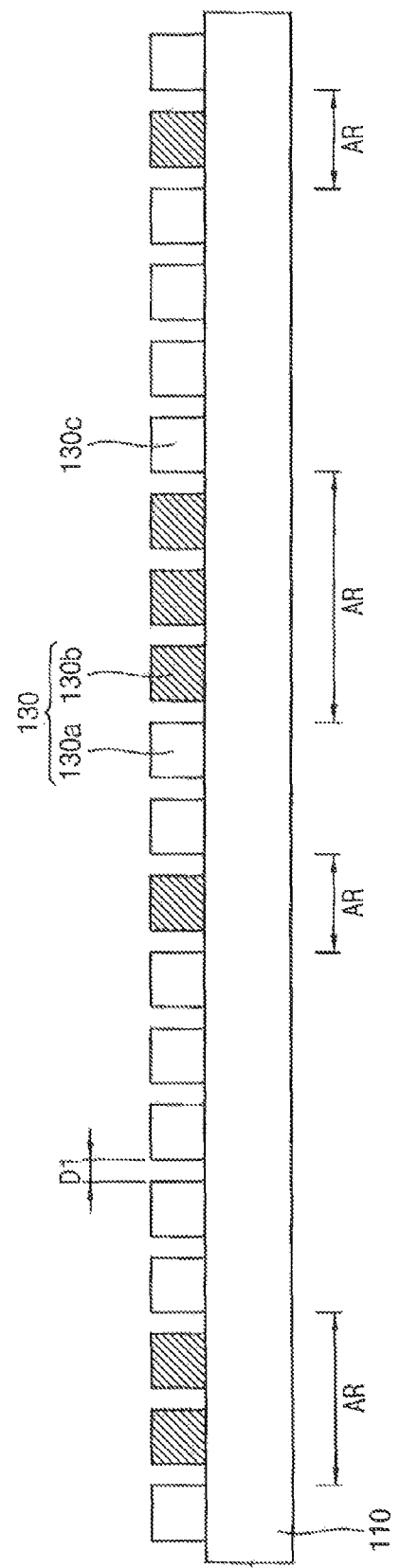

Referring to FIG. 5A, the substrate 110 may include the connection pad forming region D3, non-connection pads 130*b*, the path for moisture AR, and the peripheral region D1. The substrate 110 may have a stacked structure. The stacked structure of the substrate 110 may include an insulating film layer, an electrode patterning layer, and/or a protecting layer 150. The electrode patterning layer may be disposed on the insulating film layer. The insulating film layer may include an insulating material such as polyimide, polyester or prepreg, etc. Electrodes may be disposed in the electrode patterning layer and the connection pads 130*a* and 130*c*, which may be disposed on a pad region PR, may be electrically connected to the circuit element formed in the circuit element region CR. For example, the electrodes of the electrode patterning layer may include Al, aluminum alloy, AlNx, Ag, silver alloy, W, WNx, Cu, copper alloy, Ni, Cr, CrNx, Mo, molybdenum alloy, Ti, TiNx, Pt, Ta, TaNx, Nd, Sc, SRO, ZnOx, ITO, SnOx, InOx, GaUx and/or IZO.

Pads 130 may be disposed on the electrode patterning layer of the substrate 110. The pads 130 may include connection pads 130*a* and 130*c* and non-connection pads 130*b*. The connection pads 130*a* and 130*c* may be disposed on the connection pad forming regions D3 of the substrate 110. The connection pads 130*a* and 130*c* may receive the signal from the external device or may transmit the signal to the external device. The connection pads 130*a* and 130*c* may be electrically connected to the electrodes, which may be disposed on the substrate 110. The signal received from the external device may be transmitted to the circuit element which may be disposed on the circuit element region CR via the electrodes. For example, the connection pads 130*a* and 130*c* may be electrically connected to the circuit element via the electrode. When the connection pads 130*a* and 130*c* are electrically connected to the external device, the connection pads 130*a* and 130*b* may be electrically connected to the external device. The soldering process may be performed on the connection pads 130*a* and 130*c*. The received signal from the external device may include the electrical signal such as the power signal, the data signal, the ground signal, or the like.

The non-connection pads 130b may be disposed on the non-connection pad forming regions D4. The non-connection pads 130b disposed on the non-connection pad forming regions D4 may be electrically connected to the electrodes disposed within the substrate 110, but the non-connection pads 130b need not receive the electrical signal from the external device. For example, the non-connection pads 130b might not be electrically connected to the external device, and the soldering process may be performed on the non-connection pads 130b. For example, when the pads 130 (e.g., the connection pads 130a and 130c and the non-connection pads 130b) transmit the signal, crosstalk may be generated between the electrodes which may be connected to the pads 130. The signals may have noise due to the crosstalk. The signals having noise may generate a distortion phenomenon. Thus, the printed circuit board 100 need not use a portion pad (e.g., the non-connection pads 130b) of the pads 130. According to exemplary embodiments of the present inventive concept, as illustrated in FIG. 5A, the non-connection pads 130b may be disposed adjacent the connection pads 130a and 130c. An arrangement sequence (e.g., an arrangement order) of the connection pads 130a and 130c and the non-connection pads 130b may be configured according to a circuit configuration. The pads 130 may be spaced apart from each other at a predetermined distance. The region between the pads 130 may be the peripheral region D1. For example, the connection pads 130a and 130c, which may be disposed on the connection pad forming region D3, may be surrounded by two peripheral regions D1 adjacent the connection pad forming region D3. The non-connection pads 130b, which may be disposed on the non-connection pad forming region D4, may be surrounded by two peripheral regions D1 adjacent the non-connection pad forming region D4. When the non-connection pads 130b disposed on the non-connection pad forming regions D4 are removed from the substrate 110, the non-connection pad forming regions D4 and the peripheral region D1 adjacent the non-connection pads 130b may become the path for moisture AR. According to exemplary embodiments of the present inventive concept, when the pad region PR includes the pad forming regions DD, the pad region PR may include the connection pad forming regions D3, the non-connection pad forming regions D4, and the peripheral regions D1. For example, one non-connection pad 130b may have two peripheral regions D1 adjacent the non-connection pad 130b. For example, the path for moisture AR may include one non-connection pad forming region D4 and two peripheral regions D1. Two non-connection pads 130b may have one peripheral region D1 positioned between the non-connection pads 130b and two peripheral regions D1 adjacent the outside of the non-connection pads 130b. For example, the path for moisture AR may include two non-connection pad forming regions D4 and three peripheral regions D1.

Figure 5B:
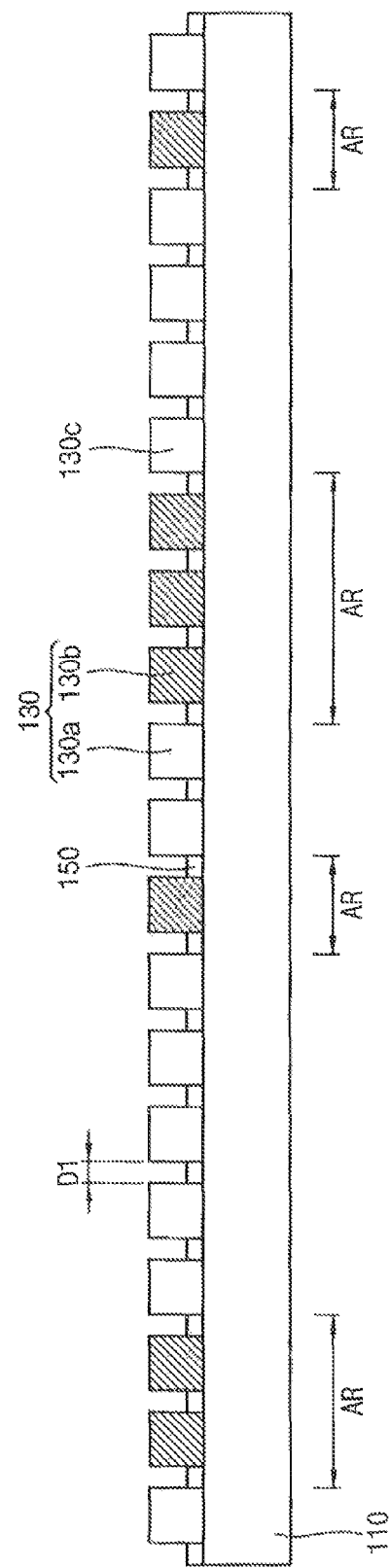

Referring to FIG. 5B, the protecting layer 150 may be disposed on the substrate 110. The protecting layer 150 may protect the electrode patterning layer. The electrode patterning layer may be electrically insulated by the protecting layer 150. Thus, the protecting layer 150 need not be disposed on a top surface of the pads 130, which may be electrically connected to an external device. The protecting layer 150 may include the solder resist.

Referring to FIG. 5C, the non-connection pads 130b disposed on the non-connection pad forming regions D4 may be removed from the substrate 110. After the non-connection pads 130b are removed from the substrate 110, a recess 190 may be formed in the non-connection pad forming regions D4. According to exemplary embodiments of the present inventive concept, the printed circuit board 100 need not initially include the non-connection pads 130b. For example, when the pads 130 are disposed on the substrate 110, the connection pads 130a and 130c may be disposed on the connection pad forming regions D3. The non-connection pads 130b need not be formed on the non-connection pad forming regions D4. When a position of the connection pads 130a and 130c and the non-connection pads 130b is changed, a position of the changed pads 130 may be changed in the process of forming the pads 130. The process of forming the pads 130 may include the process of forming the connection pads 130a and 130c on the substrate 110 and the process of forming the protecting layer 150 on the substrate 110. However, the process of removing the non-connection pads 130b from the substrate 110 need not be performed. Thus, a manufacturing cost of the printed circuit board 100 may be decreased.

Referring to FIGS. 5D and 5E, the recess 190 formed by removing the non-connection pads 130b may be filled with an auxiliary member 170. According to an exemplary embodiment of the present inventive concept, the recess 190 may be filled with the same material as that of the protecting layer 150. For example, the recess 190 may be filled with the solder resist. In the process of checking the display panel, when moisture is permeated between the flexible printed circuit board and the printed circuit board 100 via peripheral region D1 between the connection pads 130a and 130c after the printed circuit board 100 is bonded to the flexible printed circuit board, moisture may be removed via the path for moisture AR. In exemplary embodiments of the present inventive concept, as illustrated in FIG. 5E, the recess 190 may be filled with an auxiliary member 170. The auxiliary member 170 may include an absorbent such as silica gel, or the like in the process of checking the display panel, when moisture is permeated between the flexible printed circuit board and the printed circuit board 100 via peripheral region D1 between the connection pads 130a and 130c after the printed circuit board 100 is bonded to the flexible printed circuit board, moisture may be removed via the path for moisture AR. The moisture may be absorbed by the auxiliary member 170.

The printed circuit board 100 according to exemplary embodiments of the present inventive concept may include the path for moisture AR. In the process of checking the display panel, when moisture is permeated between the flexible printed circuit board and the printed circuit board 100, moisture may be removed via the path for moisture AR, and may be absorbed by the auxiliary member 170. Accordingly, the connection pads 130a and 130c of the printed circuit board 100 need not be damaged by moisture.

Figure 6:
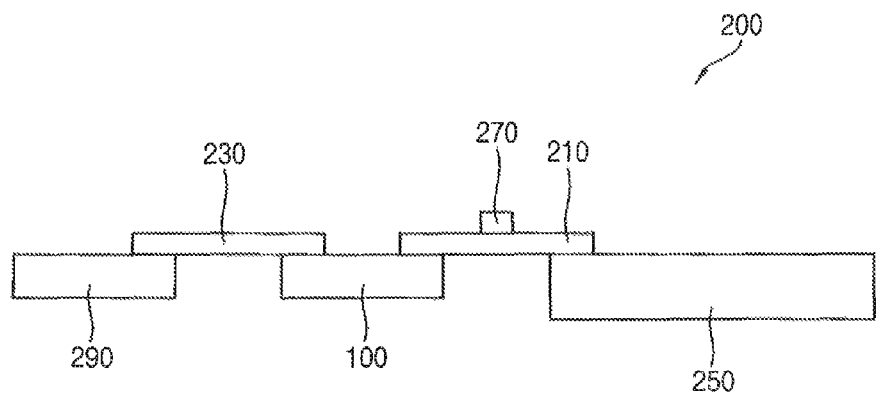
FIG. 6 is a cross-sectional view illustrating a display device in accordance with exemplary embodiments of the present inventive concept.

FIG. 6 is a cross-sectional view illustrating a display device in accordance with exemplary embodiments of the present inventive concept.

Referring to FIG. 6, a display device 200 may include the printed circuit board 100, a first flexible printed circuit board 210, a second flexible printed circuit board 230, a main printed circuit board 290, a driving integrated circuit (IC) 270, and a display panel 250.

The printed circuit board 100 illustrated in FIG. 6 may have a configuration substantially the same as or similar to that of the printed circuit board 100 described with reference to FIG. 3 except for the recess filled with the auxiliary member 170.

To control an image and an operation of the display panel 250, the main printed circuit board 290 may generate a plurality of signals. The main printed circuit board 290 may transmit the plurality of signals to the printed circuit board 100 via the second flexible printed circuit board 230. The main printed circuit board 290 and the second flexible printed circuit board 230 may be combined by the soldering process, an anisotropic conductive film (ACF), a non-conductive film (NCF) or a connector.

The printed circuit board 100 may be electrically connected to the second flexible printed circuit board 230. The printed circuit board 100 may receive the plurality of signals from the main printed circuit board 290 via the second flexible printed circuit board 230. According to an exemplary embodiment of the present inventive concept, the printed circuit board 100 and the second flexible printed circuit board 230 may be combined by the soldering process.

The driving IC 270 may be disposed on the first flexible printed circuit board 210. The first flexible printed circuit board 210 may be electrically connected to the printed circuit board 100. The first flexible printed circuit board 210 may transmit the plurality of signals from the main printed circuit board 290 to the display panel 250. The driving IC 270 may control an operation of a light emitting structure including a switching element, a light emitting layer, a cathode electrode, and/or an anode electrode. The first flexible printed circuit board 210 and printed circuit board 100 may be combined by the soldering process, the ACF, the NCF, or the connector. The first flexible printed circuit board 210 and the display panel 250 may be combined using the soldering process, the ACF, the NCF, or the connector.

The display panel 250 may include a lower substrate, the switching element, the anode electrode, the cathode electrode, the light emitting layer, and/or an encapsulation structure.

The lower substrate may include a transparent inorganic material or flexible plastic. For example, the lower substrate may include a rigid glass substrate or a quartz substrate. The lower substrate may include a flexible transparent resin substrate. The flexible transparent resin substrate may include a polyimide substrate. For example, the polyimide substrate may include a first polyimide layer, a barrier film layer and/or a second polyimide layer. According to an exemplary embodiment of the present inventive concept, the lower substrate may have a stacked structure in which the first polyimide layer, the barrier film layer, and the second polyimide layer are stacked on a glass substrate. When an insulating layer is disposed on the second polyimide layer, upper structures (e.g., the switching element, the anode electrode, the cathode electrode or the light emitting layer) may be disposed on the insulating layer. After the upper structures are thrilled, the glass substrate may be removed. After the upper structures are formed on the glass substrate (e.g., the rigid glass substrate), the polyimide substrate may be the lower substrate by removing of the glass substrate.

The switching element may be disposed on the lower substrate. The switching element may control an emission of light from the light emitting layer. According to exemplary embodiments of the present inventive concept, the switching element may be included in a semiconductor device which may include an active layer. The active layer may include an oxide semiconductor, an inorganic semiconductor (e.g., amorphous silicon or polysilicon) or an organic semiconductor. The switching element may be electrically connected to the anode electrode. The anode electrode may be disposed on the switching element, and the cathode electrode may be disposed on the anode electrode. The anode electrode and the cathode electrode may include metal, alloy, metal nitride, conductive metal oxide or a transparent conductive material. For example, the anode and the cathode electrodes may include aluminum (Al), aluminum alloy, aluminum nitride (AlNx), silver (Ag), silver alloy, tungsten (W), tungsten nitride (WNx), copper (Cu), copper alloy, nickel (Ni), chromium (Cr), chromium nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), stannum oxide (SnOx), indium oxide (InOx), gallium oxide (GaOx) and/or indium zinc oxide (IZO).

The light emitting layer may be disposed between the anode electrode and the cathode electrode. The light emitting layer may have a multilayered structure including an organic light emitting layer (EL), a hole injection layer (HIL), a hole transfer layer (HTL), an electron transfer layer (ETL) or an electron injection layer (EIL). According to an exemplary embodiment of the present inventive concept, the organic light emitting layer may include light emitting materials generating different colors of light such as red light, blue light, and/or green light in accordance with the types of pixels in the display device 100. According to exemplary embodiments of the present inventive concept, the organic light emitting layer may generate white light by stacking a plurality of light emitting materials generating different colors of light such red light, green light and/or blue light. The cathode electrode may be disposed on the light emitting layer.

The encapsulation structure may be disposed on the cathode electrode. The encapsulation structure may include a transparent insulation material or a flexible material. For example, the encapsulation structure may include the glass substrate, the quartz substrate or the transparent resin substrate. The encapsulation structure may have a stacked configuration in which at least one organic layer and at least one inorganic layer may be alternately stacked. The inorganic layer may include silicon oxide, silicon nitride, silicon oxynitride, silicon oxycarbide, silicon carbonitride, aluminum oxide, aluminum nitride, titanium oxide, zinc oxide, etc. Additionally, the organic layer may include acrylate monomer, phenylacetylene, diamine, dianhydride, siloxane, silane, parylene, olefin-based polymer, polyethylene terephthalate, fluorine resin or polysiloxane.

Figure 7:
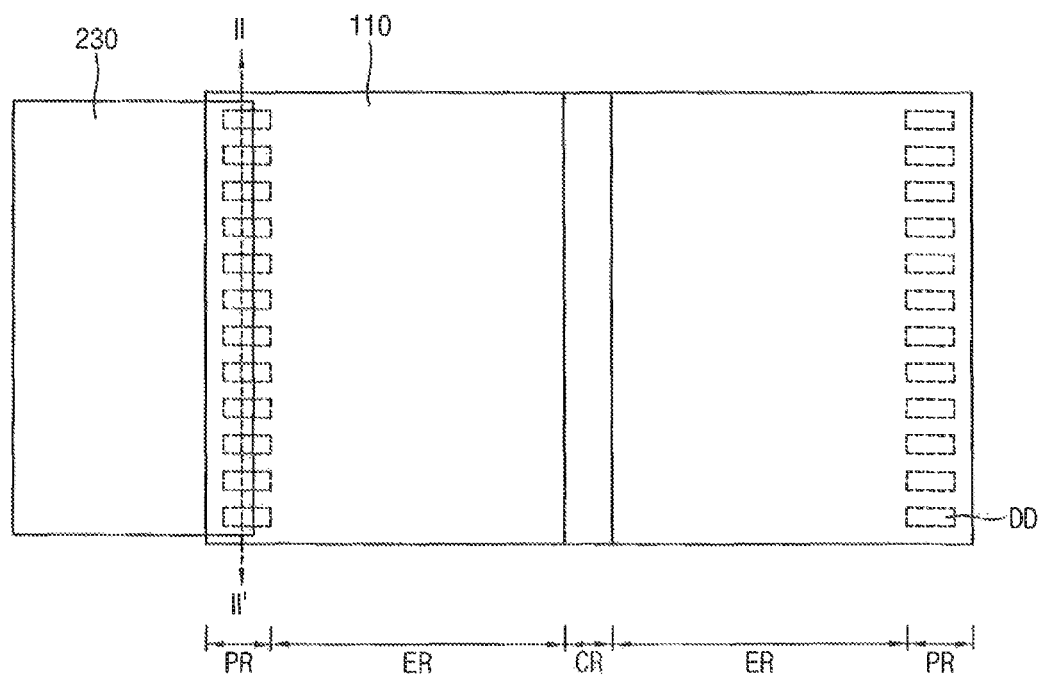
FIG. 7 is a plan view illustrating a printed circuit board and a flexible printed circuit board display panel of the display device of FIG. 6.
Figure 8:
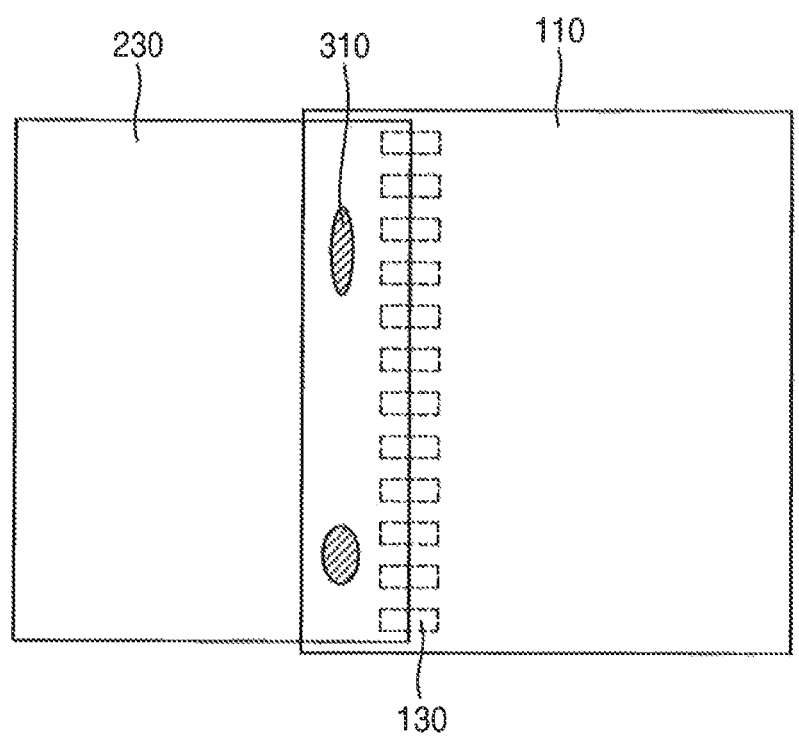
FIG. 8 is a plan view illustrating moisture permeated via a space between the printed circuit board and the flexible printed circuit board of FIG. 7.
Figure 9:
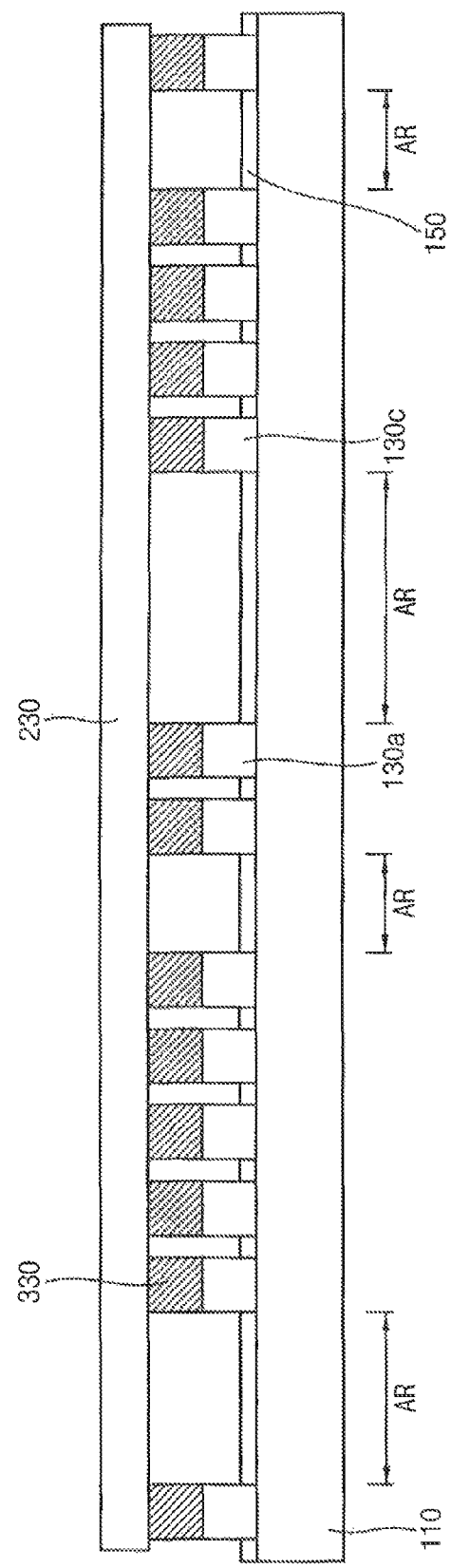
FIG. 9 is a cross-sectional view taken along a line II-II' of FIG. 7 illustrating the printed circuit board of the display device in accordance with exemplary embodiments of the present inventive concept.

FIG. 7 is a plan view illustrating a printed circuit board and a flexible printed circuit board display panel of the display device of FIG. 6, FIG. 8 is a plan view illustrating moisture permeated via a space between the printed circuit board and the flexible printed circuit board of FIG. 7. FIG. 9 is a cross-sectional view taken along a line II-IF of FIG. 7 illustrating the printed circuit board of the display device in accordance with exemplary embodiments of the present inventive concept.

The display device illustrated in FIG. 6 may be an organic light emitting diode (OLED) display device. The display device may include a liquid crystal display (LCD) device, a plasma display panel (PDP) device or an electrophoretic display device.

The printed circuit board illustrated in FIGS. 7 through 9 may have a configuration substantially the same as or similar to that of the printed circuit board described with reference to FIGS. 1 through 3.

Referring to FIGS. 7 through 9, when the second flexible printed circuit board 230 and the printed circuit board 100 are connected to each other, the display device 200 may be disposed on a display panel checking device to check a display panel 250. An inside of the display panel checking device may have a high-temperature and high-humidity. As illustrated in FIG. 8, in the process of checking the display panel 250, moisture 310 may be permeated between the second flexible printed circuit board 230 and the printed circuit board 100 via a peripheral region D1 between connection pads 130a and 130c. When the moisture 310 is permeated between the printed circuit board 100 and the second flexible printed circuit board 230, the moisture 310 might not be removed after the process of checking the display panel 250 is ended. The moisture 310 may remain between the printed circuit board 100 and the second flexible printed circuit board 230. The connection pads 130a and 130c of the printed circuit board 100 may be damaged (e.g., a short may occur) by the moisture 310. A burnt phenomenon may occur due to the damage. To prevent the burnt phenomenon, the printed circuit board 100 may include a path for moisture AR.

As illustrated in FIG. 9, the printed circuit board 100 and the second flexible printed circuit board 230 may be electrically connected by a lead 330. The lead 330 may be formed by the soldering process.

The recess that may be formed by removing the non-connection pads 130b may be filled with the auxiliary member. According to an exemplary embodiment of the present inventive concept, the recess may be filled with the same material as that of the protecting layer 150. For example, the recess may be filled with the solder resist. In the process of checking the display panel, when the moisture 310 is permeated between the flexible printed circuit board and the printed circuit board 100 via peripheral region D1 between the connection pads 130a and 130b after the printed circuit board 100 is bonded to the second flexible printed circuit board 230, the moisture 310 may be removed via the path for moisture AR.

In the display device 200 according to exemplary embodiments of the present inventive concept including the path for moisture AR, in the process of checking the display panel 250, when the moisture 310 is permeated between the second flexible printed circuit board 230 and the printed circuit board 100, the moisture 310 may be removed via the path for moisture AR. Accordingly, the connection pads 130a and 130c of the printed circuit board 100 need not be damaged by moisture.

Figure 10:
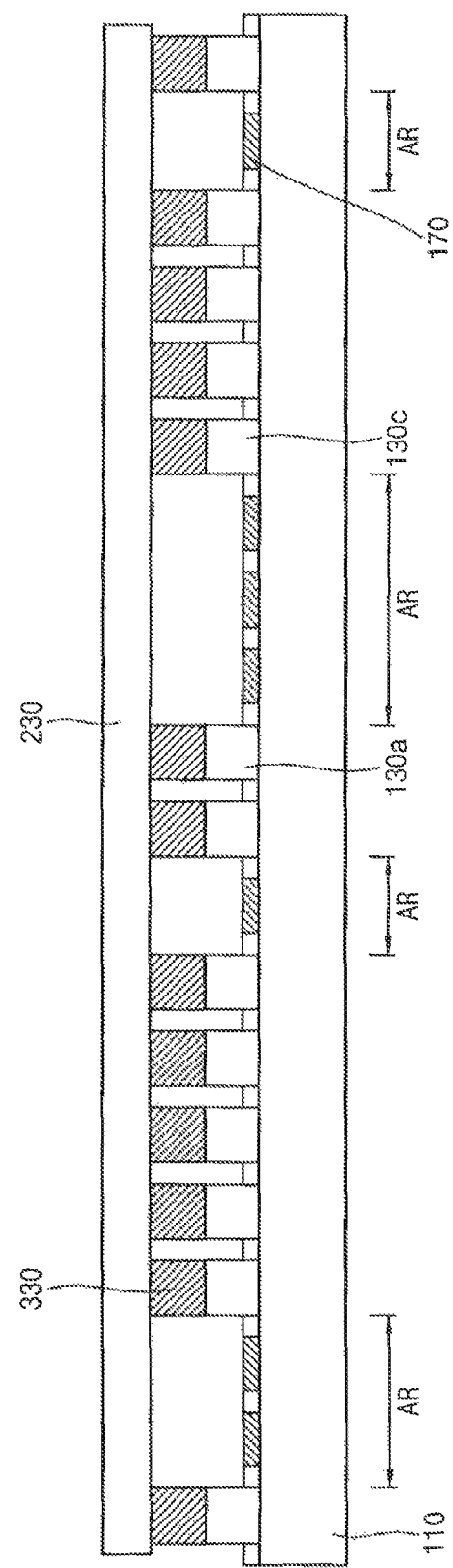
FIG. 10 is a cross-sectional view taken along the line II-II' of FIG. 7 illustrating the printed circuit board of the display device in accordance with exemplary embodiments of the present inventive concept.

FIG. 10 is a cross-sectional view taken along the line 1141' of FIG. 7 illustrating the printed circuit board of the display device in accordance with exemplary embodiments of the present inventive concept.

The printed circuit board illustrated in FIG. 10 may have a configuration substantially the same as or similar to that of the printed circuit board described with reference to FIG. 4 except for the recess filled with the auxiliary member 170.

Referring to FIG. 10, the recess of the printed circuit board may be filled with the auxiliary member 170. The auxiliary member 170 may include an absorbent such as silica gel, or the like. In the process of checking the display panel 250, when moisture 310 is permeated between the second flexible printed circuit board 230 and the printed circuit board 100 via peripheral region D1 between the connection pads 130a and 130c after the printed circuit board is bonded to a second flexible printed circuit board 230, the moisture 310 may be removed via the path for moisture AR. The moisture 310 may be absorbed by the auxiliary member 170.

When the display device 200 according to exemplary embodiments of the present inventive concept includes the path for moisture AR, in the process of checking the display panel 250, when the in moisture 310 is permeated between the second flexible printed circuit board 230 and the printed circuit board 100, the moisture 310 may be removed via the path for moisture AR, and may be absorbed by the auxiliary member 170. Accordingly, the connection pads 130a and 130c of the printed circuit board 100 need not be damaged by the moisture 310.

Exemplary embodiments of the present inventive concept may be included in the display device having the printed circuit board 100. For example, exemplary embodiments of the present inventive concept may be included in mobile phones, smart phones, laptop computers, tablet computers, personal digital assistants (PDAs), portable multimedia players (PMPs), digital cameras, music players (e.g., a MP3 players), portable game consoles or navigation devices.

While the inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A printed circuit board, comprising:
a substrate having a plurality of pad forming regions disposed thereon, wherein the pad forming regions of the plurality of pad forming regions are spaced apart from each other by a predetermined distance;
a plurality of connection pads disposed on a portion of the plurality of pad forming regions, wherein the plurality of connection pads is configured to transmit or receive a signal to an external device or from the external device; and
a path formed directly above the substrate between at least two connection pads of the plurality of connection pads, the path configured for the transportation of moisture above the substrate and between the at least two connection pads of the plurality of connection pads, wherein the substrate overlaps a lower level of the path.

2. The printed circuit board of claim 1, wherein the pad forming regions include connection pad forming regions on which the connection pads are disposed, and
non-connection pad forming regions on which the connection pads are not disposed.

3. The printed circuit board of claim 1, further comprising a solder resist disposed on the at least one of the pad forming regions on which no connection pad is disposed.

4. A printed circuit board, comprising:
a substrate having a plurality of pad forming regions disposed thereon, wherein the pad forming regions of the plurality of pad forming regions are spaced apart from each other by a predetermined distance;
a plurality of connection pads disposed on a portion of the plurality of pad forming regions, wherein the plurality of connection pads is configured to transmit or receive a signal to an external device or from the external device;
a path formed above the substrate between at least two connection pads of the plurality of connection pads, the path configured for the transportation of moisture above the substrate and between the at least two connection pads of the plurality of connection pads, wherein the substrate overlaps a lower level of the path; and
a moisture absorbent disposed on the substrate below the path.

5. The printed circuit board of claim 1, wherein the connection pads are bonded to a flexible printed circuit board that is electrically connected to the external device.

6. The printed circuit board of claim 1, wherein the signal transmitted or received through the connection pads includes a power signal, a data signal or a ground signal.

7. A display device, comprising:
a printed circuit board, wherein the printed circuit board includes:
a substrate having a plurality of pad forming regions, wherein the plurality of pad forming regions are spaced apart from each other by a predetermined distance, and a plurality of connection pads disposed on a portion of the plurality of pad forming regions, wherein the plurality of connection pads are configured to transmit or receive a signal to an external device or from the external device;
a main printed circuit board electrically connected to the printed circuit board;
a display panel electrically connected to the main printed circuit board via the printed circuit board;
a path formed above the substrate between at least two connection pads of the plurality of connection pads, the path configured for the transportation of moisture above the substrate and between the at least two connection pads of the plurality of connection pads; and
a moisture absorbent disposed on the substrate below the path.

8. The device of claim 7, further comprising:
a first flexible printed circuit board connecting the printed circuit board and the display panel; and
a second flexible printed circuit board connecting the printed circuit board and the main printed circuit board.

9. The device of claim 7, wherein a driving integrated circuit is disposed on the first flexible printed circuit board.

10. The device of claim 7, wherein the pad forming regions include connection pad forming regions on which the connection pads are disposed, and non-connection pad forming regions on which the connection pads are not disposed.

11. The device of claim 7, wherein the printed circuit board further includes a solder resist disposed on the at least one of the pad forming regions on which no connection pad is formed.

12. The device of claim 7, wherein the printed circuit board further includes a moisture absorbent disposed on the at least one of the pad forming regions on which no connection pad is formed.

13. A printed circuit board, comprising:
a substrate comprising a plurality of connection pad forming regions and a plurality of non-connection pad forming regions;
two or more connection pads disposed on the plurality of connection pad forming regions, but not on the plurality of non-connection pad forming regions, wherein the two or more connection pads is electrically connected to an external device;
at least one path configured to transport moisture disposed on at least one of the plurality of non-connection pad forming regions, wherein the at least one path is formed above the substrate between adjacent connection pads of the two or more connection pads; and
a moisture absorbent disposed on the substrate below the path.

14. The printed circuit board of claim 13, further comprising a protecting layer disposed in the at least one path.

15. The printed circuit board of claim 13, wherein the two or more connection pads are configured to transmit or receive a signal from the external device.

* * * * *